United States Patent
Motomura et al.

(10) Patent No.: US 9,237,686 B2
(45) Date of Patent: Jan. 12, 2016

(54) METHOD AND SYSTEM FOR PRODUCING COMPONENT MOUNTING BOARD

(71) Applicant: PANASONIC CORPORATION, Osaka (JP)

(72) Inventors: Koji Motomura, Osaka (JP); Arata Kishi, Nara (JP); Hiroki Maruo, Osaka (JP); Yasuhiro Suzuki, Osaka (JP); Hironori Munakata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/119,148

(22) PCT Filed: Feb. 26, 2013

(86) PCT No.: PCT/JP2013/001108
§ 371 (c)(1),
(2) Date: Nov. 20, 2013

(87) PCT Pub. No.: WO2014/024338
PCT Pub. Date: Feb. 13, 2014

(65) Prior Publication Data
US 2014/0158751 A1    Jun. 12, 2014

(30) Foreign Application Priority Data
Aug. 10, 2012 (JP) ................. 2012-178188

(51) Int. Cl.
*H05K 13/04* (2006.01)
*H05K 3/34* (2006.01)
(Continued)

(52) U.S. Cl.
CPC ............ *H05K 13/0465* (2013.01); *H01L 24/29* (2013.01); *H01L 24/32* (2013.01);
(Continued)

(58) Field of Classification Search
CPC .................................................. H05K 13/0465
USPC .......................................... 228/248.1, 180.22
See application file for complete search history.

(56) References Cited

U.S. PATENT DOCUMENTS 5,684,677 A * 11/1997 Uchida ................. H05K 3/303
174/260
6,125,043 A * 9/2000 Hauer et al. ................. 361/760
(Continued)

FOREIGN PATENT DOCUMENTS

| EP | 1833285 A1 | 9/2007 |
| JP | 2006-186011 A | 7/2006 |

(Continued)

OTHER PUBLICATIONS

International Search Report issued in PCT/JP2013/001108, dated May 7, 2013.

*Primary Examiner* — Devang R Patel
*Assistant Examiner* — Carlos Gamino
(74) *Attorney, Agent, or Firm* — McDermott Will & Emery LLP

(57) ABSTRACT

A wiring board on which an electronic component is to be mounted includes a resist having an opening exposing a joint face which is part of the surface of a wiring layer and to which a terminal of the electronic component is to be joined. In the placing step, the electronic component is placed on the wiring board such that the terminal covers the opening entirely and contacts the solder paste applied onto the joint face. Next, the solder paste applied onto the joint face is heated to melt solder and soften thermosetting resin. This allows the solder to gather in a first space within the opening closed with the wiring layer and the electronic component, while allowing the thermosetting resin to gather in a second space formed between a top side of the resist and a lateral side of the electronic component.

6 Claims, 6 Drawing Sheets

(51) Int. Cl.
*H01L 23/00* (2006.01)
*H01L 21/48* (2006.01)

(52) U.S. Cl.
CPC ............... *H01L 24/81* (2013.01); *H01L 24/83* (2013.01); *H01L 24/98* (2013.01); *H05K 3/3442* (2013.01); *H05K 3/3452* (2013.01); *H05K 3/3463* (2013.01); *H01L 21/4867* (2013.01); *H01L 2224/0401* (2013.01); *H01L 2224/0556* (2013.01); *H01L 2224/05548* (2013.01); *H01L 2224/06181* (2013.01); *H01L 2224/06187* (2013.01); *H01L 2224/16235* (2013.01); *H01L 2224/293* (2013.01); *H01L 2224/2929* (2013.01); *H01L 2224/48091* (2013.01); *H01L 2224/48227* (2013.01); *H01L 2224/73257* (2013.01); *H01L 2224/816* (2013.01); *H01L 2224/8159* (2013.01); *H01L 2224/81192* (2013.01); *H01L 2224/81815* (2013.01); *H01L 2224/81862* (2013.01); *H01L 2224/81885* (2013.01); *H01L 2224/83886* (2013.01); *H01L 2924/01322* (2013.01); *H05K 2201/099* (2013.01); *H05K 2201/10977* (2013.01)

(56) References Cited

U.S. PATENT DOCUMENTS

| | | | |
|---|---|---|---|
| 6,316,735 B1 * | 11/2001 | Higashiguchi | 174/260 |
| 6,326,239 B1 * | 12/2001 | Asai | H01L 23/544 |
| | | | 257/E21.511 |
| 6,521,997 B1 * | 2/2003 | Huang et al. | 257/737 |
| 6,678,948 B1 * | 1/2004 | Benzler et al. | 29/840 |
| 6,719,185 B2 * | 4/2004 | Suzuki | 228/173.1 |
| 7,026,188 B2 * | 4/2006 | Taguchi et al. | 438/108 |
| 7,537,961 B2 * | 5/2009 | Nakatani et al. | 438/108 |
| 7,902,678 B2 * | 3/2011 | Ohuchi et al. | 257/778 |
| 7,935,430 B2 * | 5/2011 | Suzuki et al. | 428/550 |
| 8,157,157 B2 * | 4/2012 | Sawa et al. | 228/123.1 |
| 2003/0174484 A1 * | 9/2003 | Pai | H05K 3/462 |
| | | | 361/795 |
| 2005/0023327 A1 * | 2/2005 | Pendse | 228/180.22 |
| 2006/0081999 A1 * | 4/2006 | Iwane | H01L 21/563 |
| | | | 257/778 |
| 2007/0158391 A1 * | 7/2007 | Son et al. | 228/101 |
| 2007/0175969 A1 | 8/2007 | Wada et al. | |
| 2008/0265437 A1 * | 10/2008 | Shiraishi | H01L 21/563 |
| | | | 257/778 |
| 2009/0283574 A1 * | 11/2009 | Okazaki et al. | 228/203 |
| 2009/0288866 A1 * | 11/2009 | Tsai et al. | 174/260 |
| 2010/0099222 A1 * | 4/2010 | Pendse et al. | 438/121 |
| 2012/0152597 A1 * | 6/2012 | Yamada et al. | 174/257 |

FOREIGN PATENT DOCUMENTS

| | | | | |
|---|---|---|---|---|
| JP | 2006-287060 A | 10/2006 | | |
| JP | 2007-134404 A | 5/2007 | | |
| JP | 2008-293820 A | 12/2008 | | |
| JP | 2008311538 A1 * | 12/2008 | | H01L 24/03 |
| JP | 2011-056527 A | 3/2011 | | |
| WO | 2006-070658 A1 | 7/2006 | | |

* cited by examiner

METHOD AND SYSTEM FOR PRODUCING COMPONENT MOUNTING BOARD

RELATED APPLICATIONS

This application is the U.S. National Phase under 35 U.S.C. §371 of International Application No. PCT/JP2013/001108, filed on Feb. 26, 2013, which in turn claims the benefit of Japanese Application No. 2012-178188, filed on Aug. 10, 2012, the disclosures of which Applications are incorporated by reference herein.

TECHNICAL FIELD

The present invention relates to a method and a system for producing a component mounting board, and particularly relates to a technique for mounting an electronic component on a wiring board.

BACKGROUND ART

Low-melting-point solders have been conventionally used as a joining material for electrically joining an electronic component to a wiring board. Conventionally, in order to enhance the joining strength between the wiring board and the electronic component, the solder serving to join them together has been formed in a fillet form. The solder formed in a fillet form is called a solder fillet. However, the solder fillet is insufficient for enhancing the joining strength, and when the component mounting board is exposed to external impact, the electrical junction between the wiring board and the electronic component may be broken.

Under these circumstances, in order to further enhance the joining strength, one proposal suggests the use of a solder paste including a low-melting-point solder and a thermosetting resin, as a joining material (see, for example, Patent Literature 1). When this solder paste is used in mounting to form a solder fillet, a cured resin film 104 is formed on a solder fillet 103 as illustrated in FIG. 9 (see, e.g., Patent Literature 2). Specifically, the solder paste is applied onto a joint face between an electronic component 102 and a wiring board 101, and then, the solder paste is heated, thereby to melt the solder and soften the thermosetting resin. As a result, the solder and the thermosetting resin are separated from each other, and the solder whose specific gravity is high moves downward to form the solder fillet 103, while the thermosetting resin whose specific gravity is low moves upward to form the cured resin film 104. In that way, the solder fillet 103 is reinforced by the cured resin film 104, and consequently, the joining strength is enhanced.

When an improper mounting of the electronic component (e.g., poor junction) or a defect of the electronic component itself is detected in the produced component mounting board, the component mounting board is subjected to repair work. Here, the repair work is to remove the mounted electronic component from the wiring board, and then re-mount a new electronic component on the wiring board. The electronic component is removed with the use of a tool such as a suction nozzle, while the joint (solder fillet and thermosetting resin) is heated until the solder fillet becomes molten and the thermosetting resin is softened.

CITATION LIST

Patent Literature

[PTL 1] Japanese Laid-Open Patent Publication No. 2011-56527
[PTL 2] Japanese Laid-Open Patent Publication No. 2006-287060

SUMMARY OF INVENTION

Technical Problem

However, in the repair work on the conventional component mounting board as illustrated in FIG. 9, after the removal of the electronic component 102 from the wiring board 101, a solder 105 and a thermosetting resin 106 will be left in a contacting state, on the surface of the wiring board 101 as illustrated in FIG. 10. Alternatively, the solder 105 and the thermosetting resin 106 will be left in a mixed state, on the surface of the wiring board 101. Therefore, when re-mounting a new electronic component, the thermosetting resin might enter a newly formed solder fillet, resulting in poor junction between the wiring board 101 and the new electronic component.

In view of the above, the present invention intends to provide a method and a system for producing a component mounting board in which the joining strength between the wiring board and the electronic component is high, and, in repair work, poor junction is unlikely to occur between the wiring board and the electronic component.

Solution to Problem

The production method and system according to the present invention are a method and a system for producing a component mounting board in which an electronic component is mounted on a wiring board. The wiring board includes an insulated board, a wiring layer formed on a surface of the insulated board, and a resist covering the wiring layer. The resist has an opening exposing a joint face which is part of a surface of the wiring layer and to which a terminal of the electronic component is to be electrically joined.

The production method according to the present invention includes the steps of applying a solder paste, placing the electronic component, and heating the solder paste. In the applying step, the solder paste is applied onto the joint face, the solder paste including solder and thermosetting resin. In the placing step, the electronic component is placed on the wiring board such that the terminal of the electronic component covers the opening entirely and comes in contact with the solder paste applied onto the joint face. After execution of the placing step, in the heating step, the solder paste applied onto the joint face is heated, thereby to melt the solder and soften the thermosetting resin and then to cure the thermosetting resin. In the heating step, as a result of melting of the solder and softening of the thermosetting resin, the electronic component is brought into proximity with a surface of the resist, and the solder and the thermosetting resin are separated from each other. This allows the solder to gather in a first space within the opening closed with the wiring layer and the electronic component, while allowing the thermosetting resin to gather in a second space formed between a top side of the resist and a lateral side of the electronic component.

The production system according to the present invention includes an applying machine configured to apply a solder paste, a placing machine configured to place the electronic component, and a heating machine configured to heat the solder paste. The applying machine applies the solder paste onto the joint face, the solder paste including solder and thermosetting resin. The placing machine places the electronic component on the wiring board such that the terminal of the electronic component covers the opening entirely and comes in contact with the solder paste applied onto the joint face. The heating machine heats the solder paste applied onto the joint face, thereby to melt the solder and soften the thermosetting resin and then to cure the thermosetting resin. As a result of melting of the solder and softening of the thermosetting resin by the heating machine, the electronic component is brought into proximity with a surface of the resist, and the solder and the thermosetting resin are separated from each other. This allows the solder to gather in a first space within the opening closed with the wiring layer and the electronic component, while allowing the thermosetting resin to gather in a second space formed between a top side of the resist and a lateral side of the electronic component.

Advantageous Effects of Invention

According to the production method and system of the present invention, it is possible to produce a component mounting board in which the joining strength between the wiring board and the electronic component is high, and in repair work, poor junction is unlikely to occur between the wiring board and the electronic component.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF EMBODIMENTS

First, a description is given of a component mounting board produced by the production method and system according to the present invention.

The produced component mounting board includes a wiring board and an electronic component mounted on the wiring board. The wiring board includes an insulated board, a wiring layer formed on a surface of the insulated board, and a resist covering the wiring layer. The resist has an opening. The opening exposes from the resist, a joint face which is part of a surface of the wiring layer and to which a terminal of the electronic component is to be electrically joined, and the opening is entirely covered with the terminal.

A first space within the opening closed with the wiring layer and the electronic component is filled with solder, and the solder electrically joins the terminal and the joint face to each other. No thermosetting resin exists in the first space. Even if thermosetting resin exists in the first space, the amount thereof is as small as about 5 vol %. In a second space formed between a top side of the resist and a lateral side of the electronic component, a cured material of thermosetting resin mechanically joins the resist and the electronic component to each other. No solder exists in the second space. Even if solder exists in the second space, the amount thereof is as small as about 5 vol %.

In a third space formed between the top side of the resist and an underside of the electronic component, a cured material of thermosetting resin mechanically joins the resist and the electronic component to each other. No solder exists in the third space. Even if solder exists in the third space, the amount thereof is as small as about 5 vol %.

Examples of the aforementioned component mounting board are specifically described below, with reference to drawings.

Figure 1:
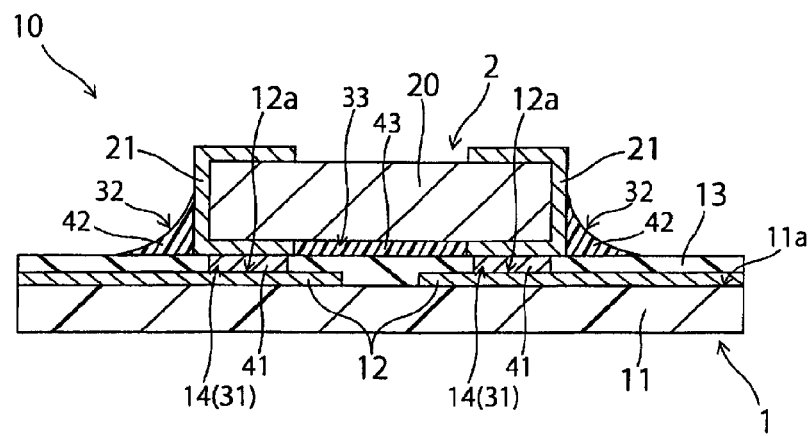
FIG. 1 A cross-sectional view of an example of a component mounting board produced by the production method and system according to the present invention FIG. 2 A cross-sectional view of another example of the component mounting board produced by the production method and system according to the present invention FIG. 3 An enlarged view of region III in FIG. 2

FIG. 1 is a cross-sectional view of an example of the component mounting board. As illustrated in FIG. 1, a component mounting board 10 includes a wiring board 1, and an electronic component 2 mounted on the wiring board 1. The wiring board 1 includes an insulated board 11, a wiring layer 12 (wiring pattern) formed on a surface 11a of the insulated board 11, and a solder resist 13 covering the wiring layer 12.

The electronic component 2 has a component main body 20 comprising a passive element such as a capacitor element, and two electrode layers 21 formed at both ends of the component main body 20 (the right and left side ends on the sheet of FIG. 1). Part of each electrode layer 21 extends onto an underside of the component main body 20. Therefore, in the electronic component 2, two terminals, which are constituted of the electrode layers 21, are exposed on the underside of the electronic component 2.

As illustrated in FIG. 1, the solder resist 13 is provided with two openings 14 corresponding one by one to the electrode layers 21. The openings 14 expose from the solder resist 13, joint faces 12a which are each part of the surface of the first wiring layer 12 and to which the electrode layers 21 are to be electrically joined. Each of the openings 14 is entirely covered with the electrode layer 21 corresponding to the opening 14. This allows the spaces within the openings 14 to be spaces (first spaces 31) which are each closed with the wiring layer 12 and the electronic component 21.

The first spaces 31 are each filled with a solder 41, and the solder 41 electrically joins the electrode layer 21 and the joint face 12a to each other. No thermosetting resin exists in the first spaces 31. Even if thermosetting resin exists in the first spaces 31, the amount thereof is as small as about 5 vol %. The solder 41 is, for example, a low-melting-point solder such as a Sn—Bi solder or Sn—Bi—Ag solder.

Furthermore, as illustrated in FIG. 1, in each of second spaces 32 formed between a top side of the solder resist 13 and lateral sides of the electronic component 2, a cured material 42 of thermosetting resin exists. No solder exists in the second spaces 32. Even if solder exists in each of the second spaces 32, the amount thereof is as small as about 5 vol %. Specifically, the cured material 42, in each of the second spaces 32, fills the corner formed by the solder resist 13 and the electronic component 2 and extends in a fillet form over and around the corner. In that way, the cured material 42, in each of the second spaces 32, mechanically joins the solder resist 13 and the electronic component 2 to each other. The thermosetting resin constituting the cured material 42 is, for example, an epoxy resin.

Furthermore, in a third space 33 formed between the top side of the solder resist 13 and the underside of the component main body 20, a cured material 43 of thermosetting resin exists. Therefore, the cured material 43 is interposed between the top side of the solder resist 13 and the underside of the component main body 20. No solder exists in the third space 33. Even if solder exists in the third space 33, the amount thereof is as small as about 5 vol %. In that way, the cured material 43, in the third space 33, mechanically joins the solder resist 13 and the electronic component 2 to each other. Note that in this embodiment, the third space 33 is formed between the two electrode layers 21. The thermosetting resin constituting the cured material 43 is the same as that constituting the cured material 42.

Figure 9:
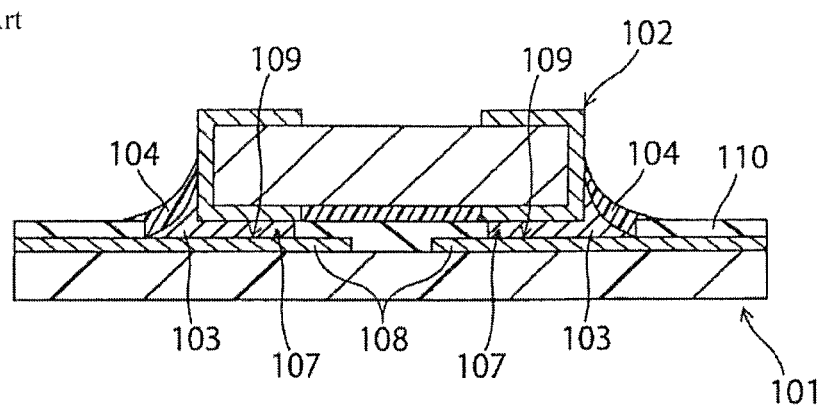
FIG. 9 A cross-sectional view of a conventional component mounting board
Figure 10:
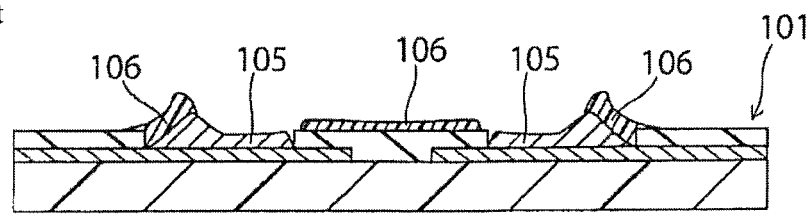
FIG. 10 A cross-sectional view for explaining the state of the wiring board from which the electronic component has been removed in the repair work on the conventional component mounting board

In the aforementioned component mounting board 10, each opening 14 is entirely covered with the electrode layer 21 corresponding to the opening 14. Therefore, the size of each opening 14 is smaller than that of an opening 107 (see FIG. 9), which corresponds to the opening 14, of the conventional component mounting board. Specifically, the area of each opening 14 is 50 to 100% of the area of an underside of the electrode layer 21 corresponding to the opening 14. Note that as illustrated in FIG. 9, in the conventional component mounting board, each opening 107 is merely partially covered with the electronic component 102.

Figure 2:
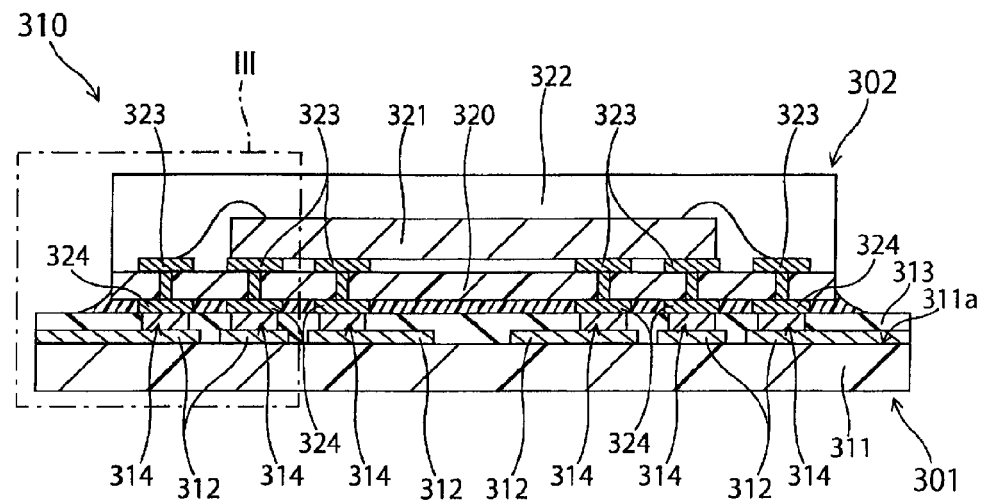
Figure 3:
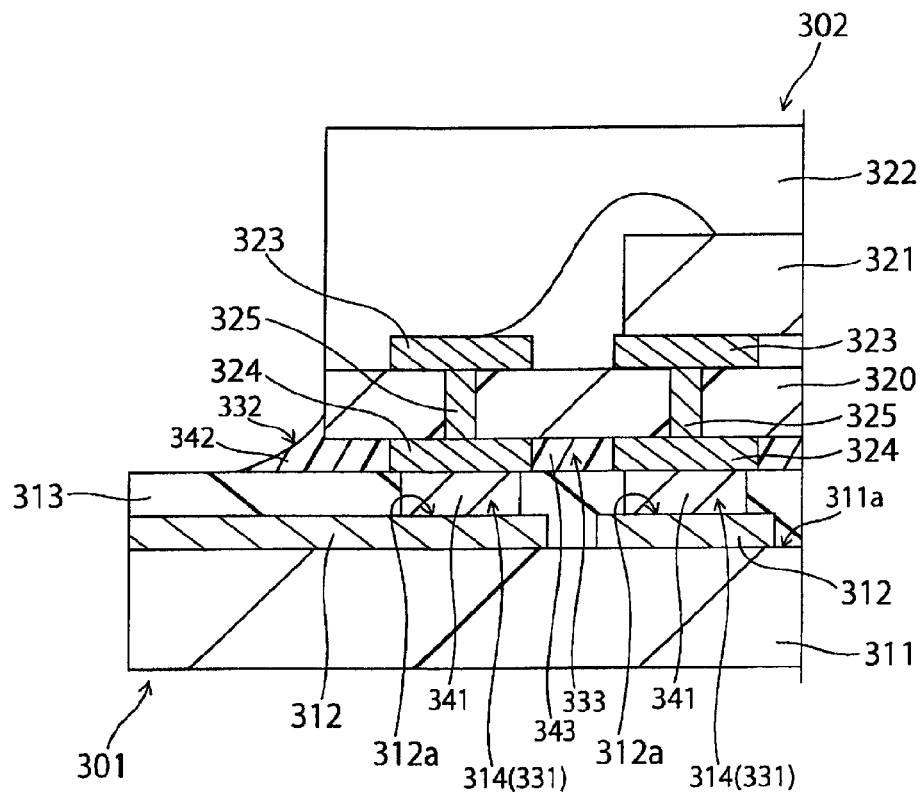

FIG. 2 is a cross-sectional view of another example of the component mounting board. FIG. 3 is an enlarged view of region III in FIG. 2. As illustrated in FIG. 2, a component mounting board 310 includes a wiring board 301, and a land grid array (LGA)-type electronic component 302 mounted on the wiring board 301. The electronic component 302 has a substrate 320, a semiconductor element 321 placed on the substrate 320, and a housing 322 encapsulating the semiconductor element 321 on the substrate 320.

The substrate 320 has a top side on which a plurality of first flat electrodes 323 (lands) are formed, and an underside on which a plurality of second flat electrodes 324 (lands) are formed. Here, the second flat electrodes 324 are arrayed in a grid. To the first flat electrodes 323, the terminals (not shown) of the semiconductor element 321 are electrically connected. Furthermore, as illustrated in FIG. 3, each first flat electrode 323 and its corresponding second flat electrode 324 are electrically connected to each other through a conductive via 325 passing through the substrate 320 from its top side to its underside. Therefore, in the electronic component 302, a plurality of terminals, which are constituted of the second flat electrodes 324, are exposed on the underside of the electronic component 302.

As illustrated in FIGS. 2 and 3, the wiring board 301 includes an insulated board 311, a wiring layer 312 formed on a surface 311a of the insulated board 311, and a solder resist 313 covering the wiring layer 312. The solder resist 313 is provided with a plurality of openings 314 corresponding one by one to the second flat electrodes 324. As illustrated in FIG. 3, the openings 314 expose from the solder resist 313, joint faces 312a which are each part of the surface of the wiring layer 312 and to which the second flat electrodes 324 are to be electrically joined. Each of the openings 314 is entirely covered with the second flat electrode 324 corresponding to the opening 314. This allows the spaces within the openings 314 to be spaces (first spaces 331) which are each closed with the wiring layer 312 and the electronic component 302.

The first spaces 331 are each filled with a solder 341, and the solder 341 electrically joins the second flat electrode 324 and the joint face 312a to each other. No thermosetting resin exists in the first spaces 331. Even if thermosetting resin exists in the first spaces 331, the amount thereof is as small as about 5 vol %. The solder 341 is, for example, a low-melting-point solder such as a Sn—Bi solder or Sn—Bi—Ag solder.

Furthermore, as illustrated in FIG. 3, in each of second spaces 332 formed between a top side of the solder resist 313 and lateral sides of the electronic component 302, a cured material 342 of thermosetting resin exists. No solder exists in the second spaces 332. Even if solder exists in each of the second spaces 332, the amount thereof is as small as about 5 vol %. Specifically, the cured material 342, in each of the second spaces 332, fills the corner formed by the solder resist 313 and the electronic component 302 and extends in a fillet form over and around the corner. In that way, the cured material 342, in each of the second spaces 332, mechanically joins the solder resist 313 and the electronic component 302 to each other. The thermosetting resin constituting the cured material 342 is, for example, an epoxy resin.

Furthermore, in third spaces 333 formed between the top side of the solder resist 313 and the underside of the substrate 320, a cured material 343 of thermosetting resin exists. Therefore, the cured material 343 is interposed between the top side of the solder resist 313 and the underside of the electronic component 302. No solder exists in the third spaces 333. Even if solder exists in the third spaces 333, the amount thereof is as small as about 5 vol %. In that way, the cured material 343, in the third spaces 333, mechanically joins the solder resist 313 and the electronic component 302 to each other. Note that the thermosetting resin constituting the cured material 343 is the same as that constituting the cured material 342.

In the aforementioned component mounting board 310 also, like in the component mounting board 10, each opening 314 is entirely covered with the second flat electrode 324 corresponding to the opening 314. Therefore, the size of each opening 314 is smaller than that of the opening of the conventional component mounting board including an LGA-type electronic component. Specifically, the area of each opening 314 is 50 to 100% of the area of an underside of the second flat electrode 324 corresponding to the opening 314.

Next, a description is given of a method and a system for producing a component mounting board according to the present invention.

The production method and system according to the present invention are a method and a system for producing a component mounting board in which an electronic component is mounted on a wiring board. The wiring board includes an insulated board, a wiring layer formed on a surface of the insulated board, and a resist covering the wiring layer. The resist has an opening exposing a joint face which is part of a surface of the wiring layer and to which a terminal of the electronic component is to be electrically joined.

The production method according to the present invention includes the steps of applying a solder paste, placing the electronic component, and heating the solder paste. In the applying step, the solder paste is applied onto the joint face, the solder paste including solder and thermosetting resin. In the placing step, the electronic component is placed on the wiring board such that the terminal of the electronic component covers the opening entirely and comes in contact with the solder paste applied onto the joint face. At this time, the electronic component is placed on the wiring board, usually with an underside of the electronic component being spaced apart from a surface of the resist. After execution of the placing step, in the heating step, the solder paste applied onto the joint face is heated, thereby to melt the solder and soften the thermosetting resin and then to cure the thermosetting resin.

The aforementioned applying, placing and heating steps are executed by respectively using an applying machine, a placing machine and a heating machine included in the production system described below.

The production system according to the present invention includes an applying machine which applies a solder paste, a placing machine which places the electronic component on the wiring board, and a heating machine which heats the solder paste. The applying machine applies the solder paste onto the joint face, the solder paste including solder and thermosetting resin. The placing machine places the electronic component on the wiring board such that the terminal of the electronic component covers the opening entirely and comes in contact with the solder paste applied onto the joint face. At this time, the electronic component is placed on the wiring board, usually with an underside of the electronic component being spaced apart from a surface of the resist. The heating machine heats the solder paste applied onto the joint face, thereby to melt the solder and soften the thermosetting resin and then to cure the thermosetting resin.

According to the aforementioned production method and system, as a result of melting of the solder and softening of the thermosetting resin by heating of the solder paste, the electronic component is brought into proximity with the surface of the resist, and the solder and the thermosetting resin are separated from each other. This allows the solder to gather in a first space within the opening closed with the wiring layer and the electronic component, while allowing the thermosetting resin to gather in a second space formed between a top side of the resist and a lateral side of the electronic component. Furthermore, this allows the thermosetting resin to gather in a third space formed between a top side of the resist and the underside of the electronic component.

Thereafter, further heating of the solder paste cures the thermosetting resin. In the subsequent cooling process, the solder is solidified. As a result, the wiring board and the electronic component are electrically joined to each other via the solidified solder in the first space. And, as a result of curing of the thermosetting resin, cured materials are formed in the second and third spaces, and the wiring board and the electronic component are mechanically joined to each other via the cured materials in the second and third spaces.

In the component mounting board thus produced, the communication between the first and second spaces and the communication between the first and third spaces are blocked by the electronic component. Consequently, the second and third spaces are formed at positions away from the first space along the top side of the resist. Therefore, the cured material in the second space and the cured material in the third space will not come in contact with the solder in the first space.

As such, in the repair work on the component mounting board, after the removal of the electronic component from the wiring board, even though the solder and thermosetting resin are left on the wiring board, the solder stays within the opening, and the thermosetting resin stays on the top side of the resist without coming in contact with the solder. For this reason, even when a new electronic component is re-mounted, the thermosetting resin is unlikely to enter the solder. Therefore, even when the component mounting board is subjected to repair work, poor junction is unlikely to occur between the wiring board and the new electronic component.

In the aforementioned component mounting board, the wiring board and the electronic component are joined to each other via the solder in the first space. In addition, the wiring board and the electronic component are joined to each other via the cured materials of thermosetting resin in the second and third spaces. Therefore, in the aforementioned component mounting board, the bonding strength between the wiring board and the electronic component is high.

In a preferred configuration of the production method and system, the solder paste is applied onto the joint face such that the total volume of the solder included in the solder paste on the joint face becomes substantially equal to the volume of the first space (applying step and applying machine). The total volume of the solder is preferably 95 to 100% of the volume of the first space. This can prevent the entry of the thermosetting resin into the solder in the first space, and thus can prevent the occurrence of poor junction. Moreover, this can prevent the solder from overflowing the opening and entering the cured material in the second space, and thus can prevent the reduction in joining strength.

In the following, as one embodiment of the present invention, a producing system for producing the component mounting board 10 of FIG. 1 is specifically described, with reference to drawings. It is to be noted that the production system described below is applicable also to the production of the component mounting board 310 of FIG. 2.

Figure 4:
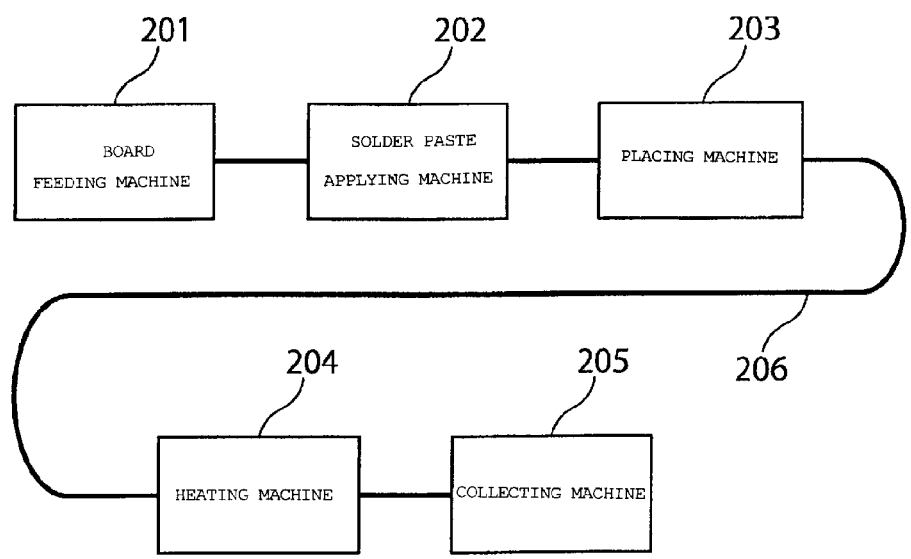
FIG. 4 A block diagram of a production line constituting a production system according to one embodiment of the present invention FIG. 5 A cross-sectional view illustrating a specific configuration of the production line FIG. 6 A cross-sectional view for explaining a position (mounting position) where an electronic component is placed on a wiring board by a placing machine included in the production line FIG. 7 A cross-sectional view for explaining the state of a solder paste when the solder paste is heated by a heating machine included in the production line FIG. 8 A cross-sectional view for explaining the state of the wiring board from which the electronic component has been removed in the repair work on the component mounting board of FIG. 1

FIG. 4 is a block diagram of a production line constituting the production system according to this embodiment. As illustrated in FIG. 4, the production line includes a board feeding machine 201 which feeds the wiring board 1, a solder paste applying machine 202, a placing machine 203 which places the electronic component 2 on the wiring board 1, a heating machine 204, a collecting machine 205 which collects the produced component mounting board 10, and a conveying machine 206 which conveys the wiring board 1 through these machines.

Figure 5:
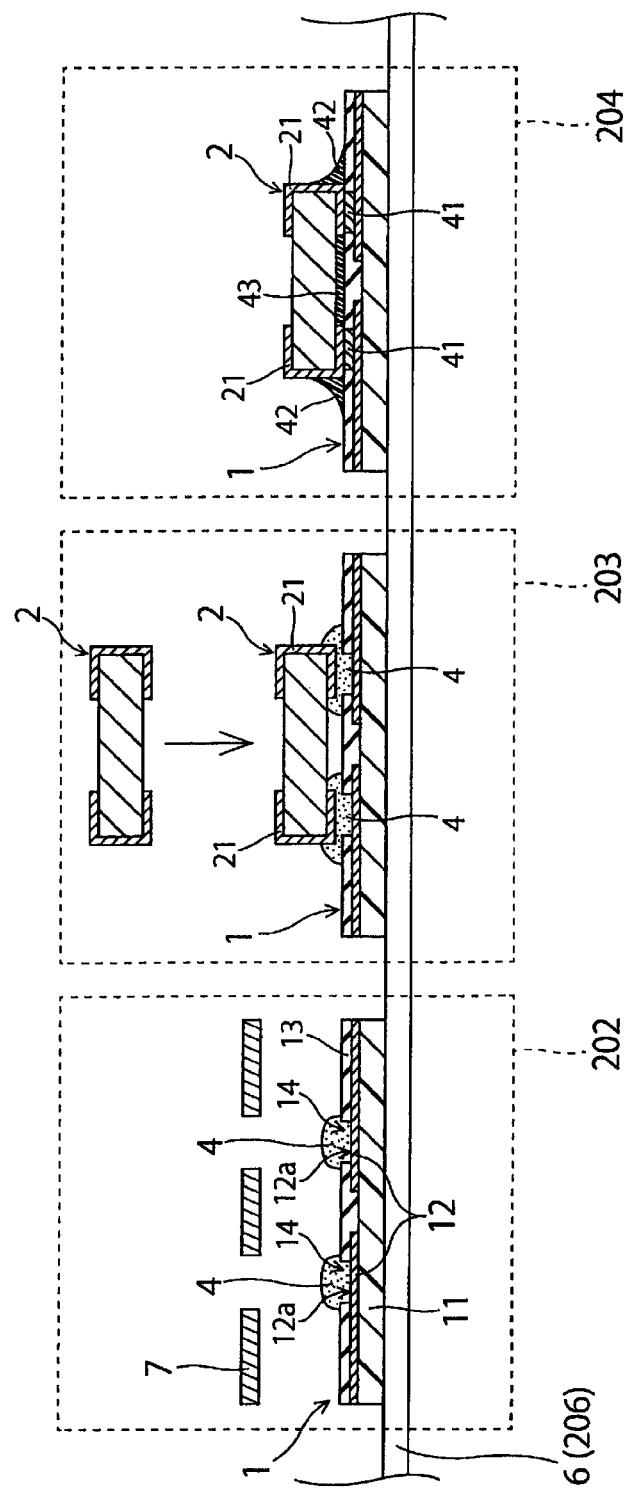

FIG. 5 is a cross-sectional view illustrating a specific configuration of the production line. As illustrated in FIG. 5, the conveying machine 206 is constituted of a conveyor having a conveyor belt 6. It is to be noted, however, that the conveying machine 206 is not limited to the conveyor, and may be any machine with conveying function. On the conveyor belt 6, the wiring board 1 fed from the board feeding machine 201 is loaded. The board feeding machine 201 is, for example, a magazine-type board loader.

The solder paste applying machine 202 applies the solder paste 4 including solder and thermosetting resin onto the wiring board 1. Specifically, the solder paste applying machine 202 applies the solder paste 4 to the openings 14, so that the solder paste 4 is applied onto the joint faces 12*a*. At this time, the solder paste applying machine 202 applies the solder paste 4 to the openings 14 such that the total volume of the solder included in the solder paste 4 on each joint face 12*a* becomes substantially equal to the volume of the first space 31 corresponding to the joint face 12*a* (see FIG. 1). The total volume of the solder is preferably 95 to 100% of the volume of the first space 31.

In this embodiment, as mentioned above, the size of the opening 14 is smaller than that of the opening 107 (see FIG. 9) of the conventional component mounting board. Therefore, given that the thickness of the solder resist 13 is the same as that of a solder resist 110 (see FIG. 9) of the conventional component mounting board, the following problem will arise: when the same amount of the solder paste 4 as that has been applied to each opening 107 in the production process of the conventional electrical component is applied to each opening 14, the total volume of the solder included in the applied solder paste 4 exceeds the volume of the first space 31 corresponding to the opening 14; and so, in the component mounting board produced, the solder overflows the first space 31 and comes in contact with the thermosetting resin.

Therefore, in this embodiment, in order to make the volume of each first space 31 equal to the aforementioned total volume of the solder, the thickness of the solder resist 13 is set large. Specifically, the thickness is set to 30 to 70 μm. Alternatively, in order to make the aforementioned total volume of the solder equal to the volume of each first space 31, the solder paste applying machine 202 is adjusted to apply a smaller amount of solder paste 4 to each opening 14. In an alternative, in order to make the aforementioned total volume of the solder equal to the volume of each first space 31, the solder paste 4 may be prepared such that the content of solder in the solder paste 4 becomes small.

The solder and thermosetting resin constituting the solder paste 4 are, for example, a low-melting-point solder such as a Sn—Bi solder or Sn—Bi—Ag solder, and an epoxy resin, respectively. The solder paste 4 may optionally contain an activator or a thixotropic agent. The solder and thermosetting resin are not limited to these materials. It is to be noted, however, that an epoxy resin can be suitably used as the thermosetting resin because it is easy to handle and has high strength after curing and good curing characteristics.

The solder paste applying machine 202 used in this embodiment is a screen printing machine. In FIG. 5, a mask 7 for screen printing is shown. In the solder paste applying machine 202, the position of the mask 7 is adjusted according to the position and posture of the wiring board 1, whereby the applying position of the solder paste 4 is adjusted. Examples of the solder paste applying machine 202 include a printing machine equipped with a printing nozzle (e.g., an ink jet printer), and a dispensing machine equipped with a dispensing head (needle or nozzle) and a dispenser.

Figure 6:
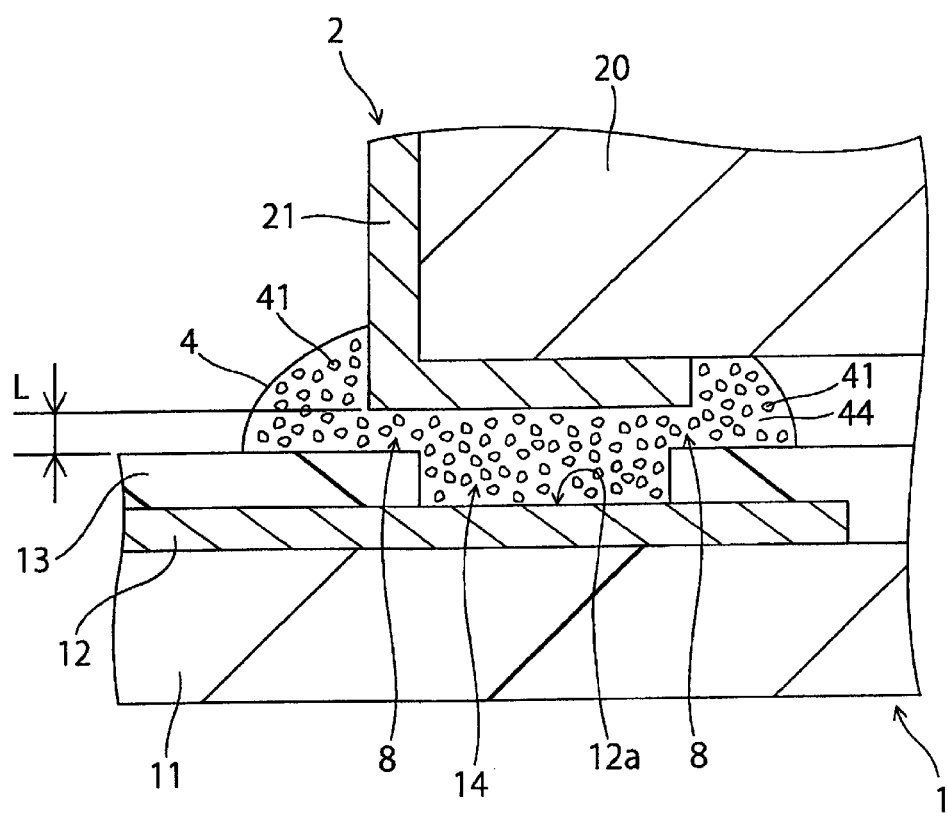

The placing machine 203 places the electronic component 2 at a placement position on the wiring board 1. The placement position is, as illustrated in FIG. 6, a position at which each electrode layer 21 of the electronic component 2 covers entirely the opening 14 corresponding to the electrode layer 21 and is brought into contact with the solder paste 4 applied onto the joint face 12a corresponding to the electrode layer 21. The placing machine 203 places the electronic component 2 on the wiring board 1 such that the underside of the electrode layer 21 is spaced apart by a predetermined distance L from the surface of the solder resist 13. The placement machine 203 is equipped with, for example, an electronic component feeder, and a chip mounter for placing the electronic component 2 fed from the electronic component feeder, at the aforementioned placement position. Examples of the electronic component feeder include a tape feeder, bulk feeder, and tray feeder. Examples of the chip mounter include a suction nozzle.

As illustrated in FIG. 6, immediately after the electronic component 2 is placed at the placement position on the wiring board 1, the solder 41 is distributed throughout the solder paste 4. In addition, a gap 8 is present between the electrode layer 21 and the solder resist 13.

Figure 7:
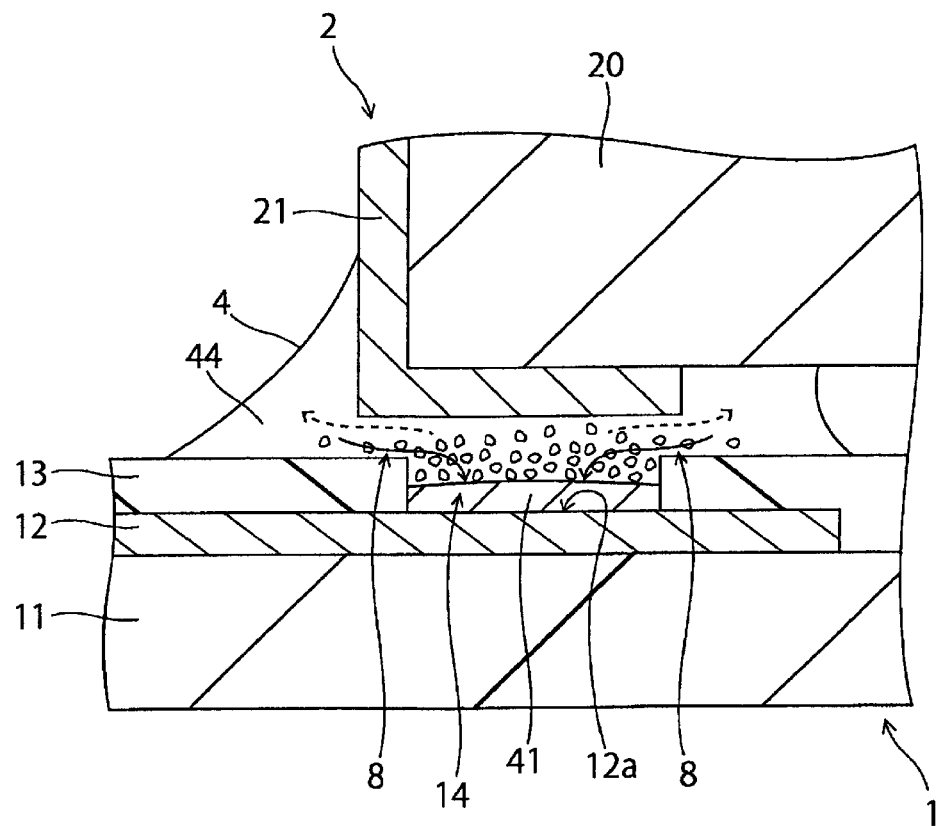

The heating machine 204 heats the solder paste 4 applied onto each joint face 12a, thereby to melt the solder 41 in the solder paste 4 and soften a thermosetting resin 44 (see FIG. 6) in the solder paste 4. The solder resist 13 has a property of not allowing the molten solder 41 to easily adhere to its surface, in other words, a property of easily repelling the molten solder 41. Therefore, as illustrated in FIG. 7, the molten solder 41 moves through the gap 8 to where the solder resist 13 does not exist (specifically, into the opening 14). In FIG. 7, the behavior in which the solder 41 moves is shown in solid-line arrows.

The specific gravity of the solder 41 is higher than that of the thermosetting resin 44. Therefore, as illustrated in FIG. 7, the solder 41 moves downward within each opening 14, and accumulates on each joint face 12a. On the other hand, as the solder 41 moves into the opening 14, the thermosetting resin 44 in the opening 14 is forced out of the opening 14. The thermosetting resin 44 then moves through the gap 8 onto the solder resist 13. In FIG. 7, the behavior in which the thermosetting resin 44 moves is shown in dotted-line arrows.

As the solder 41 and the thermosetting resin 44 move, the electronic component 2 approaches the surface of the solder resist 13. Consequently, each opening 14 is closed with the electrode layer 21 corresponding to the opening 14, forming the first space 31 (see FIG. 1). In association with this, the second and third spaces 32 and 33 (see FIG. 1) are formed on the solder resist 13. Therefore, the communication between the first and second spaces 31 and 32 and the communication between the first and third spaces 31 and 33 are blocked by the electronic component 2.

As a result, in the first spaces 31, the solder 41 gathers, while the thermosetting resin 44 is excluded therefrom. Even if the thermosetting resin 44 is included in the first spaces 31, the amount thereof in each first space 31 is as small as about 5 vol %. In the second and third spaces 32 and 33, the thermosetting resin 44 gathers, while the solder 41 is excluded therefrom. Even if the solder 41 is included in the second and third spaces 32 and 33, the amount thereof in each space is as small as about 5 vol %.

Thereafter, the heating apparatus 204 further heats the solder paste 4, thereby to cure the thermosetting resin 44. In the subsequent cooling process, the solder 41 is solidified. As a result, the wiring board 1 and the electronic component 2 are electrically joined to each other via the solidified solder 41 in the first spaces 31. And, as a result of curing of the thermosetting resin 44, cured materials 42 and 43 are formed in the second and third spaces 32 and 33, and the wiring board 1 and the electronic component 2 are mechanically joined to each other via the cured materials 42 and 43 in the second and third spaces 32 and 33.

In that way, the component mounting board 10 illustrated in FIG. 1 is produced.

The collecting machine 205 collects the produced component mounting board 10 from the conveyor belt 6. Examples of the collecting machine 205 include a magazine-type board unloader.

In the component mounting board 10, the communication between the first and second spaces 31 and 32 and the communication between the first and third spaces 31 and 33 are blocked by the electronic component 2. Consequently, the second and third spaces 32 and 33 are formed at positions away from the first spaces 31 along the top side of the solder resist 13. Therefore, the cured material 42 in the second spaces 32 and the cured material 43 in the third space 33 will not come in contact with the solder 41 in the first spaces 31.

Figure 8:
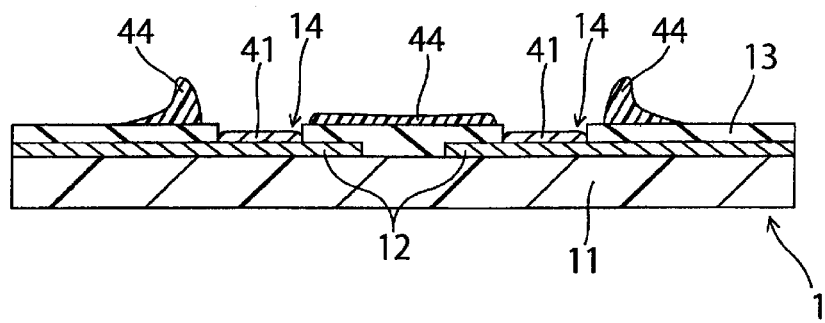

As such, in the repair work on the component mounting board 10, after the removal of the electronic component 2 from the wiring board 1 as illustrated in FIG. 8, even though the solder 41 and the thermosetting resin 44 are left on the wiring board 1, the solder 41 stays within the first openings 14, and the thermosetting resin 44 stays on the top side of the solder resist 13 without coming in contact with the solder 41. For this reason, even when a new electronic component 2 is re-mounted, the thermosetting resin is unlikely to enter the solder. Therefore, even when the component mounting board 10 is subjected to repair work, poor junction is unlikely to occur between the wiring board 1 and the new electronic component 2.

Moreover, in the component mounting board 10, the wiring board 1 and the electronic component 2 are joined to each other via the solder 41 in the first spaces 31. In addition, the wiring board 1 and the electronic component 2 are joined to each other via the cured material 42 in the second spaces 32 and via the cured material 43 in the third space 33. Therefore, in the component mounting board 10, the bonding strength between the wiring board 1 and the electronic component 2 is high.

In the conventional component mounting board illustrated in FIG. 9, the opening 107 exposes from the solder resist 110, the joint faces 109 which are each part of the surface of the wiring layer 108 and to which the electronic component 102 is to be electrically joined. The electronic component 102 is electrically joined to the joint faces 109 via the solder fillets 103, with the both ends of the electronic component being spaced apart from the joint faces 109. Therefore, in the production process of the conventional component mounting board, when the solder paste for forming the solder fillets 103 is applied onto the two joint faces 109, if the amount of the solder paste applied onto one of the two joint faces 109 is different from that onto the other, the following phenomenon is likely to occur: when the solder solidifies after its melting by heating of the solder paste, due to the difference in the solidifying speed caused by the difference in the applied amount, one end of the electronic component 102 is pulled toward the joint face 109, and as a result, the electronic component 102 is inclined.

On the other hand, in the component mounting board 10, both ends of the electronic component 2 are situated on the surface of the solder resist 13. Therefore, even if one end of the electronic component 2 is pulled downward, the downward movement of the one end is stopped by the solder resist 13. As such, the electronic component 2 is unlikely to be inclined.

The constituents of the present invention are not limited to those in the aforementioned embodiments, and include various variants within the technical scope recited in the claims. In the aforementioned embodiment, the board feeding machine 201, the solder paste applying machine 202, the placing machine 203, the heating machine 204, and the collecting machine 205 are separately and independently constituted. However, the present invention is not limited to this. For example, some or all of these machines may be replaced with a composite machine having those functions.

The production method and system described above can be applied to the mounting of a ball grid array (BGA)-type component on a wiring board. In addition, the production method and system described above can be applied to the production of various component mounting boards, without being limited to the production of the component mounting board 10 of FIG. 1 or the component mounting board 310 of FIG. 2 including an LGA-type electronic component.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

INDUSTRIAL APPLICABILITY

The production method and system according to the present invention are applicable to the production of a component mounting board to be included in an electronic device such as a liquid crystal display module.

REFERENCE SIGNS LIST

1 Wiring board
2 Electronic component
4 Solder paste
10 Component mounting board
11 Insulated board
11a Surface
12 Wiring layer
12a Joint face
13 Solder resist
14 Opening
21 Electrode layer (terminal)
31 First space
32 Second space
33 Third space
41 Solder
42, 43 Cured material
44 Thermosetting resin
201 Board feeding machine
202 Solder paste applying machine
203 Placing machine
204 Heating machine
205 Collecting machine
301 Wiring board
302 Electronic component
310 Component mounting board
311 Insulated board
311a Surface
312 Wiring layer
312a Joint face
313 Solder resist
314 Opening
324 Second flat electrode (terminal)
331 First space
332 Second space
333 Third space
341 Solder
342, 343 Cured material
L Predetermined distance

The invention claimed is:

1. A method for producing a component mounting board in which an electronic component is mounted on a wiring board, the wiring board comprising an insulated board, a wiring layer formed on a surface of the insulated board, and a resist covering the wiring layer, and the resist having an opening exposing a joint face which is part of a surface of the wiring layer and to which a terminal of the electronic component is to be electrically joined, the method comprising the steps of:
 (a) applying a solder paste including solder and thermosetting resin, onto the joint face;
 (b) placing the electronic component on the wiring board such that the terminal of the electronic component covers the opening entirely and comes in contact with the solder paste applied onto the joint face; and
 (c) after execution of the step (b), heating the solder paste applied onto the joint face, thereby to melt the solder and soften the thermosetting resin and then to cure the thermosetting resin, wherein:
 in the step (c), as a result of melting of the solder and softening of the thermosetting resin, the electronic component is brought into proximity with a surface of the resist, and the solder and the thermosetting resin are separated from each other, allowing the solder to gather in a first space within the opening closed with the wiring layer and the electronic component, while allowing the thermosetting resin to gather in a second space formed between a top side of the resist and a lateral side of the electronic component, and communication between the first and the second spaces is blocked by the electronic component after a cooling process subsequent to step (c).

2. The method for producing a component mounting board according to claim 1, wherein in the step (a), the solder paste is applied such that a total volume of the solder included in the solder paste on the joint face becomes substantially equal to a volume of the first space.

3. The method for producing a component mounting board according to claim 1, wherein in the step (b), the electronic component is placed on the wiring board, with an underside of the electronic component being spaced apart from the surface of the resist.

4. The method for producing a component mounting board according to claim 1, wherein in the step (a), the solder paste is applied on the joint face such that a total volume of the solder included in the solder paste becomes 95% to 100% of a volume of the first space.

5. A method for producing a component mounting board in which an electronic component is mounted on a wiring board, the wiring board comprising an insulated board, a wiring layer formed on a surface of the insulated board, and a resist covering the wiring layer, and the resist having an opening exposing a joint face which is part of a surface of the wiring layer and to which a terminal of the electronic component is to be electrically joined, the method comprising steps of:

(a) applying a solder paste including solder and thermosetting resin, onto the joint face;

(b) placing the electronic component on the wiring board such that the terminal of the electronic component covers the opening entirely and comes in contact with the solder paste applied onto the joint face;

(c) after execution of the step (b), heating the solder paste applied onto the joint face, thereby to melt the solder and soften the thermosetting resin such that the electronic component is brought into proximity with a surface of the resist, and the solder and the thermosetting resin are separated from each other, and then to cure the thermosetting resin to form a cured material; and (d) after execution of step (c), executing cooling process to solidify the solder such that the wiring board and the electronic component are electrically joined to each other via the solidified solder in the first space within the opening closed with the wiring layer and the electronic component, and the wiring board and the electronic component are mechanically joined to each other via the cured material in the second space formed between a top side of the resist and a lateral side of the electronic component, wherein the cured material in the second space does not come in contact with the solder in the first space.

6. The method for producing a component mounting board according to claim 5, wherein in the step (a), the solder paste is applied on the joint face such that a total volume of the solder included in the solder paste becomes 95% to 100% of a volume of the first space.

* * * * *